(12) United States Patent
Wang

(10) Patent No.: US 10,493,602 B2
(45) Date of Patent: Dec. 3, 2019

(54) COMPRESSING APPARATUS AND COMPRESSING JIG THEREOF

(71) Applicant: Horng Terng Automation Co., Ltd., Kaohsiung (TW)

(72) Inventor: Yu Hsien Wang, Kaohsiung (TW)

(73) Assignee: Horng Terng Automation Co., Ltd., Kaohsiung (TW)

( * ) Notice: Subject to any disclaimer, the term of this patent is extended or adjusted under 35 U.S.C. 154(b) by 238 days.

(21) Appl. No.: 15/801,558

(22) Filed: Nov. 2, 2017

(65) Prior Publication Data
US 2019/0061111 A1 Feb. 28, 2019

(30) Foreign Application Priority Data
Aug. 29, 2017 (TW) .............................. 106129384 A

(51) Int. Cl.
| | |
|---|---|
| *B25B 11/02* | (2006.01) |
| *H01L 23/373* | (2006.01) |
| *B25B 5/06* | (2006.01) |
| *B25B 5/14* | (2006.01) |
| *B25B 27/26* | (2006.01) |
| *H01L 23/00* | (2006.01) |
| *H01L 21/673* | (2006.01) |

(Continued)

(52) U.S. Cl.
CPC .............. *B25B 11/02* (2013.01); *B25B 5/064* (2013.01); *B25B 5/145* (2013.01); *B25B 27/26* (2013.01); *H01L 21/67333* (2013.01); *H01L 21/67356* (2013.01); *H01L 23/3735* (2013.01); *H01L 24/00* (2013.01); *H01L 2023/405* (2013.01); *H01L 2023/4068* (2013.01); *H05K 7/2049* (2013.01)

(58) Field of Classification Search
CPC .......... B25B 11/00; B25B 11/02; B23P 11/00; B23P 11/005; B23P 21/00; B23P 23/00; B23Q 1/03; B23Q 1/25; B23Q 1/52; H01L 23/3735
See application file for complete search history.

(56) References Cited

U.S. PATENT DOCUMENTS

| | | | | |
|---|---|---|---|---|
| 5,060,920 A | * | 10/1991 | Engibarov | .............. B25B 1/241 269/282 |
| 6,012,711 A | * | 1/2000 | Cipolla | .................. B23Q 3/186 269/20 |

(Continued)

*Primary Examiner* — Lee D Wilson
(74) *Attorney, Agent, or Firm* — C. G. Mersereau; DeWitt LLP

(57) ABSTRACT

A compressing apparatus has a compressing jig and a pressing device. The compressing jig has a lower compressing assembly and an upper compressing assembly. The lower compressing assembly has a lower mount with at least one pitching plate and at least one limiting set. Each one of the at least one limiting set has multiple poles disposed around a corresponding pitching plate. Each one of the multiple poles has a top end higher than the corresponding pitching plate and a limiting indention disposed at the top end with a supporting portion disposed at a same height with the corresponding pitching plate. The upper compressing assembly has at least one clamping plate respectively aligned with the at least one pitching plate and being movable up and down. The pressing device has a base with a receiving space to receive the upper compressing assembly.

18 Claims, 18 Drawing Sheets

(51) Int. Cl.
  *H01L 23/40*  (2006.01)
  *H05K 7/20*  (2006.01)

(56) References Cited

U.S. PATENT DOCUMENTS

| | | | |
|---|---|---|---|
| 6,644,637 B1* | 11/2003 | Shen | B25B 5/061 |
| | | | 269/152 |
| 2006/0157905 A1* | 7/2006 | Lenzini | B25B 11/005 |
| | | | 269/21 |
| 2018/0311795 A1* | 11/2018 | Morton | B25B 11/002 |
| 2019/0061111 A1* | 2/2019 | Wang | B25B 11/02 |

* cited by examiner

COMPRESSING APPARATUS AND COMPRESSING JIG THEREOF

BACKGROUND OF THE INVENTION

1. Field of the Invention

The present invention relates to a jig for evenly compressing work pieces.

2. Description of Related Art

Clock rate of a semiconductor device continually increases with the rising processing speed of the semiconductor device. The semiconductor device with high clock rate functions at a high operating temperature. In order to keep the semiconductor device function at an acceptable operating temperature and prevent the semiconductor device from slowing down or being damaged by the exceeding temperature, a conventional semiconductor device is not only provided with heat dissipation structure such as a heat sink, but also has a heat spreader mounted to a substrate with a die. The heat spreader of the conventional semiconductor device increases a cooling area of the semiconductor device and dissipates heat.

In a packaging procedure of semiconductor devices, a thermal conductive adhesive is coated on the substrate with the die at first, and then the heat spreader is disposed on the substrate. The semiconductor with the substrate, the die, and the heat spreader are disposed on a carrier. Multiple semiconductor devices are disposed on the carrier. The carrier with multiple semiconductor devices is transported into a packaging apparatus for packaging semiconductor devices. The packaging apparatus has an upper pressing unit and a lower pressing unit. The upper pressing unit and the lower pressing unit respectively press the substrate and the heat spreader of each one of the multiple semiconductor devices. The substrate and the heat spreader of each semiconductor device are fixed together by the thermal conductive adhesive coated on the substrate.

Though a conventional packaging apparatus is able to combine the substrate and the heat spreader of each semiconductor device, the substrate and the heat spreader of each semiconductor device are difficult to keep parallel. Thickness of each semiconductor device cannot be restricted, and distribution of the thermal conductive adhesive between the substrate and the heat spreader of each semiconductor device is uneven. The heat generated by each semiconductor device during operation is hard to dissipate equally and causes unstable functioning of the semiconductor device.

To overcome the shortcomings of the conventional packaging apparatus of semiconductor devices, the present invention provides a compressing apparatus with a compressing jig to mitigate or obviate the aforementioned problems.

SUMMARY OF THE INVENTION

The main objective of the present invention is to provide a compressing apparatus that is able to evenly compress a work piece.

The compressing apparatus comprises a compressing jig and a pressing device. The compressing jig has a lower compressing assembly and an upper compressing assembly. The lower compressing assembly has a lower mount with at least one pitching plate and at least one limiting set. Each one of the at least one limiting set has multiple poles disposed around a corresponding pitching plate. Each one of the multiple poles has a top end higher than the corresponding pitching plate and a limiting indention disposed at the top end with a supporting portion disposed at a same height with the corresponding pitching plate. The upper compressing assembly has at least one clamping plate respectively aligned with the at least one pitching plate and being movable up and down. The pressing device has a base with a receiving space to receive the upper compressing assembly.

Other objects, advantages, and novel features of the invention will become more apparent from the following detailed description when taken in conjunction with the accompanying drawings.

DETAILED DESCRIPTION OF PREFERRED EMBODIMENTS

The present invention provides a compressing apparatus for semiconductor devices and a compressing jig thereof.

Figure 1:
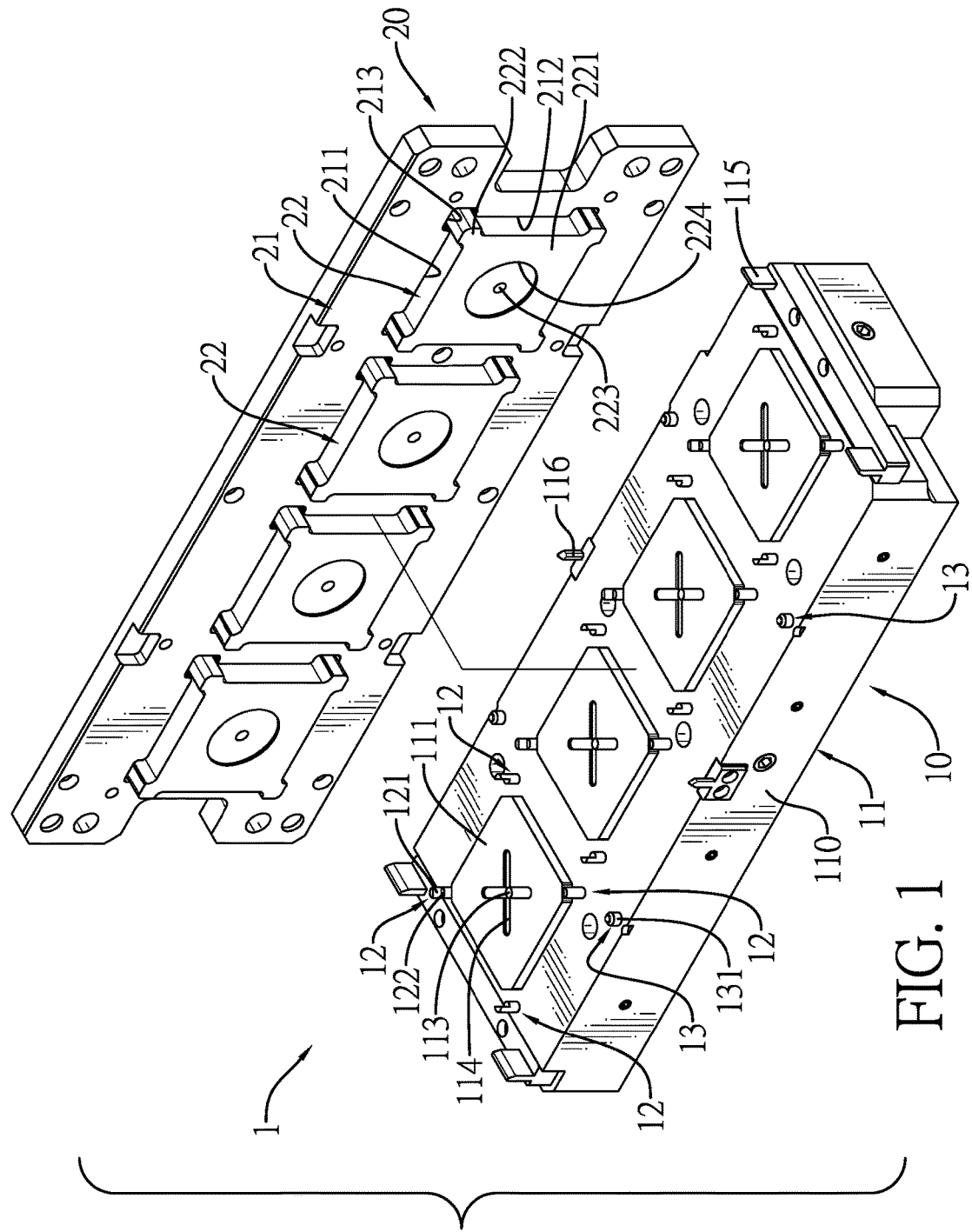
FIG. 1 is an exploded perspective view of a first embodiment of a compressing jig in accordance with the present invention.

With reference to FIG. 1, a first embodiment of the compressing jig 1 in accordance with the present invention has a lower compressing assembly 10 and an upper compressing assembly 20. The lower compressing assembly 10 is utilized for disposing a carrier 70 carrying work pieces such as semiconductor devices. The lower compressing assembly 10 is connected to an elevating mechanism and a vacuum pump. The lower compressing assembly 10 is driven by the elevating mechanism and is movable up and down to provide an upward pushing force to the work pieces disposed on the carrier 70. The vacuum pump is utilized for optionally sucking a lower part of one of the work pieces such as a substrate of a semiconductor device.

Figure 2:
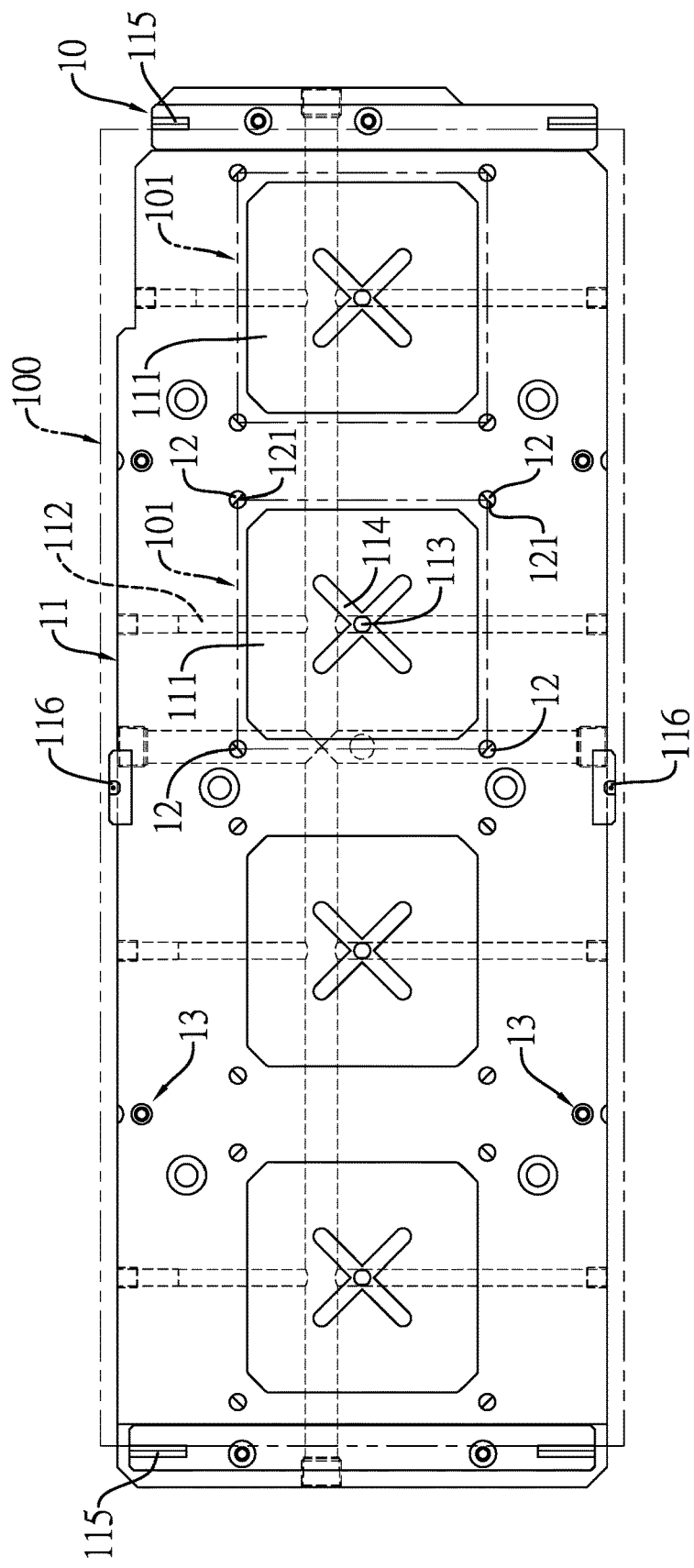
FIG. 2 is a top view of a lower compressing assembly of the compressing jig in FIG. 1.
Figure 3:
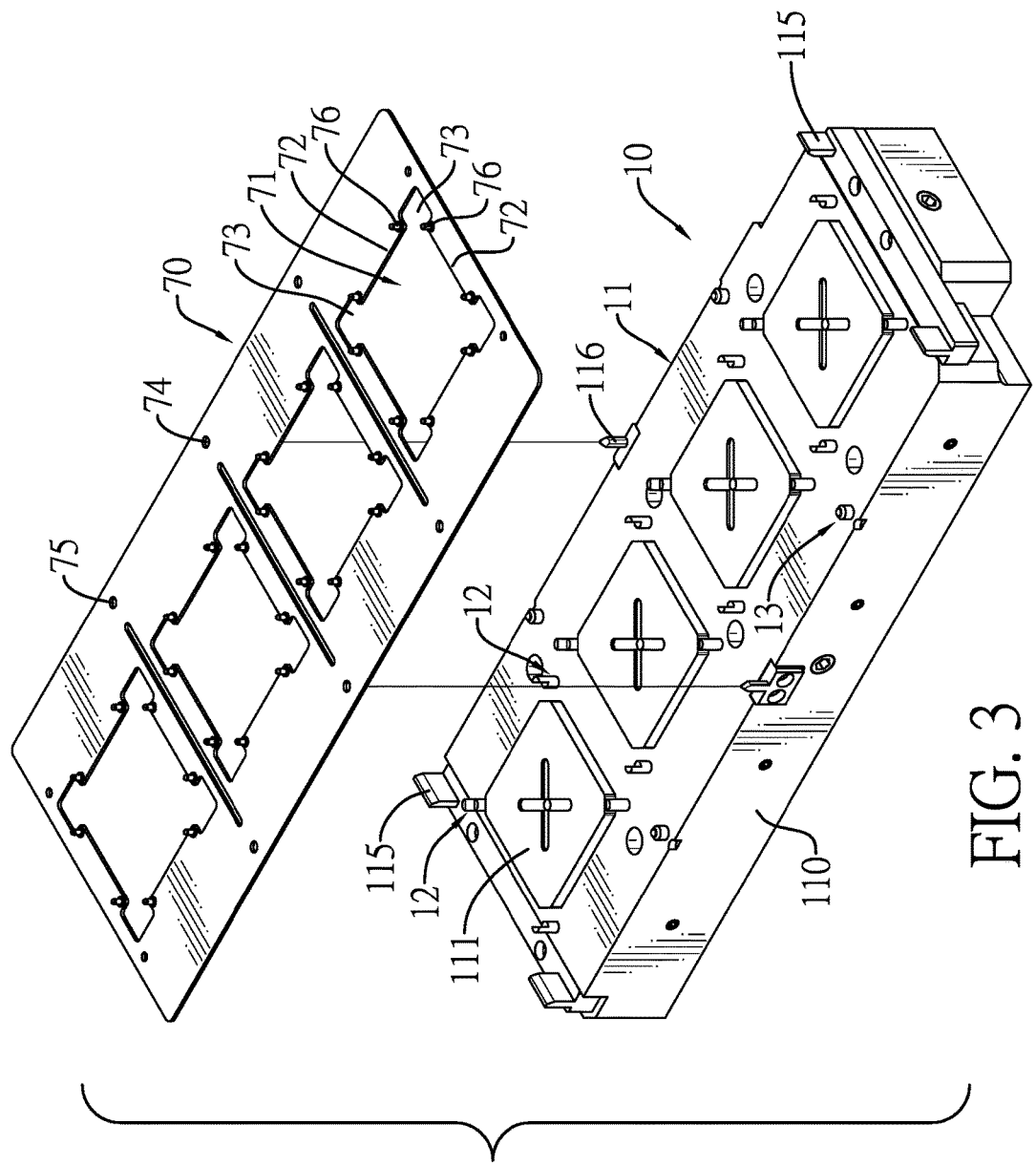
FIG. 3 is a partial exploded perspective view of the compressing jig in FIG. 1, shown with a carrier.

With reference to FIGS. 1, 2, and 3, the lower compressing assembly 10 has a lower mount 11, at least one limiting set, multiple pairs of positioning poles, at least two blocking portions 115, and multiple supporting plungers 13. The lower mount 11 has a main body 110, a positioning area 100, at least one locating section 101, at least one pitching plate 111, and at least one exhausting channel 112. The main body 110 is rectangular and has a lengthwise direction, two ends, two lateral sides, a top portion, and a top face disposed at the top portion of the main body 110. The two ends of the main body 110 are opposite each other in the lengthwise direction of the main body 110. The two lateral sides of the main body 110 extend along the lengthwise direction of the main body 110, and are parallel to each other. The positioning area 100 is disposed at the top portion of the main body 110. The at least one locating section 101 is disposed within the positioning area 100 and is rectangular. In the first embodiment of the present invention, the at least one locating section 101 extends along the lengthwise direction of the main body 110. The at least one locating section 101 may also be disposed in an array.

The at least one pitching plate 111 is disposed on the top face of the main body 110, is respectively disposed within the at least one locating section 101, and protrudes upwardly. Each one of the at least one pitching plate 111 has a pitching face and a cross groove 114. The pitching face faces upwardly and has an area and a middle portion. The area of the pitching face of each one of the at least one pitching plate 111 is smaller than an area of a corresponding locating section 101. The at least one exhausting channel 112 is formed inside the main body 110 and respectively extends through the at least one middle portion of the at least one pitching face of the at least one pitching plate 111. Each one of the at least one exhausting channel 112 has an exhausting hole 113 disposed at the middle portion of the pitching face of the corresponding pitching plate 111.

The cross groove 114 of each one of the at least one pitching plate 111 is formed in the pitching face of the pitching plate 111, and communicates with the exhausting channel 112 that extends toward the corresponding pitching plate 111. In the first embodiment of the present invention, the exhausting hole 113 of each one of the at least one exhausting channel 112 is disposed at a middle portion of the cross groove 114, and communicates with the exhausting channel 112 and the cross groove 114. The vacuum pump communicates with the at least one exhausting channel 112.

With reference to FIGS. 1, 2, and 3, the at least one limiting set is disposed on the top face of the main body 110 of the lower mount 11 and respectively within the at least one locating section 101 of the lower mount 11. Each one of the at least one limiting set has multiple poles disposed on the top face of the lower mount 11 and around a corresponding pitching plate 111.

With reference to FIGS. 1, 2, and 3, the at least two blocking portions 115 protrude upwardly, are disposed adjacent to an edge of the positioning area 100, and are separated by the positioning area 100. In the first embodiment of the present invention, the at least two blocking portions 115 are two in amount. The two blocking portions 115 are respectively disposed at the two ends of the main body 110.

With reference to FIGS. 1, 2, and 3, the multiple positioning poles 116 are disposed within the positioning area 100. The multiple positioning poles 116 are divided into multiple pairs. The two positioning poles 116 of each pair are separated by the at least one locating section 101. In the first embodiment of the present invention, the lower compressing assembly 10 has a pair of positioning poles 116. The two positioning poles 116 are respectively disposed at the two lateral sides of the main body 110.

With reference to FIGS. 1, 2, and 3, the at least one limiting set is respectively disposed within the at least one locating section 101. Each one of the at least one limiting set has multiple poles 12 disposed on the top face of the main body 110 and around a corresponding pitching plate 111 that is disposed within a corresponding locating section 101. Each one of the multiple poles 12 has a top end and a limiting indention 121. The top end of each one of the multiple poles 12 is higher than the pitching face of the corresponding pitching plate 111. The limiting indention 121 of each one of the multiple poles 12 has a supporting portion 122 disposed at a same height of the corresponding pitching plate 111. A distance is defined between the top end and the supporting portion 122 of each one of the multiple poles 12. Said distance is determined according to a thickness of each one of the work pieces.

With reference to FIGS. 1, 2, and 3, the multiple supporting plungers 13 are disposed within the positioning area 100 of the lower mount 11 and out of the at least one locating section 101. Each one of the multiple supporting plungers 13 has a supporting pole 131 and a spring disposed beneath the supporting pole 131 to abut against the supporting pole 131. The supporting pole 131 of each one of the multiple supporting plungers 13 is abutted by the spring of the supporting plunger 13, and is able to reach out from the main body 110 to support the carrier 70. The supporting pole 131 of each one of the multiple supporting plungers 13 may retract in the main body 110 when subjected to a pressing force.

With reference to FIGS. 1, 2, and 3, the upper compressing assembly 20 is disposed above the lower compressing assembly 10, and is movable up and down. The upper compressing assembly 20 has an upper mount 21 and at least one clamping plate 22. The upper mount 21 has at least one receiving hole 211 formed in the upper mount 21. Each one of the at least one receiving hole 211 has a main area 212 and four minor areas 213. The main area 212 has four corners. The four minor areas 213 are respectively disposed at the four corners of the main area 212 and communicate with the main area 212.

The at least one clamping plate 22 is respectively aligned with the at least one pitching plate 111, respectively aligned with the at least one limiting set, and respectively disposed in the at least one receiving hole 211. Each one of the at least one clamping plate 22 is movable up and down in a corresponding receiving hole 211. Each one of the at least one clamping plate 22 has a main portion 221 and four minor portions 222. The main portion 221 has four corners and is received in the main area 212 of the corresponding receiving hole 211. The four minor portions 222 are respectively disposed at the four corners of the clamping plate 22 and are respectively received in the four minor areas 213 of the corresponding receiving hole 211. The four minor portions 222 are disposed above the multiple supporting portions 122 of the multiple limiting indentions 121 of the multiple poles 12 of a corresponding limiting set.

Each one of the at least one clamping plate 22 has a clamping face, a round recess 224, and a venting channel. The clamping face of each one of the at least one clamping plate 22 faces to the lower compressing assembly 10, is parallel to the pitching face of a corresponding pitching plate 111, and has a middle portion. The round recess 224 is formed in the middle portion of the clamping plate 22 and has a middle portion. The venting channel extends through the middle portion of the clamping face of the clamping plate 22, and has a venting hole 223 disposed at the middle portion of the clamping face of the clamping plate 22. In the first embodiment of the present invention, the venting hole 223 is disposed at the middle portion of the round recess 224 of the clamping plate 22, and communicates with the round recess 224 and the venting channel of the clamping plate 22.

Figure 4:
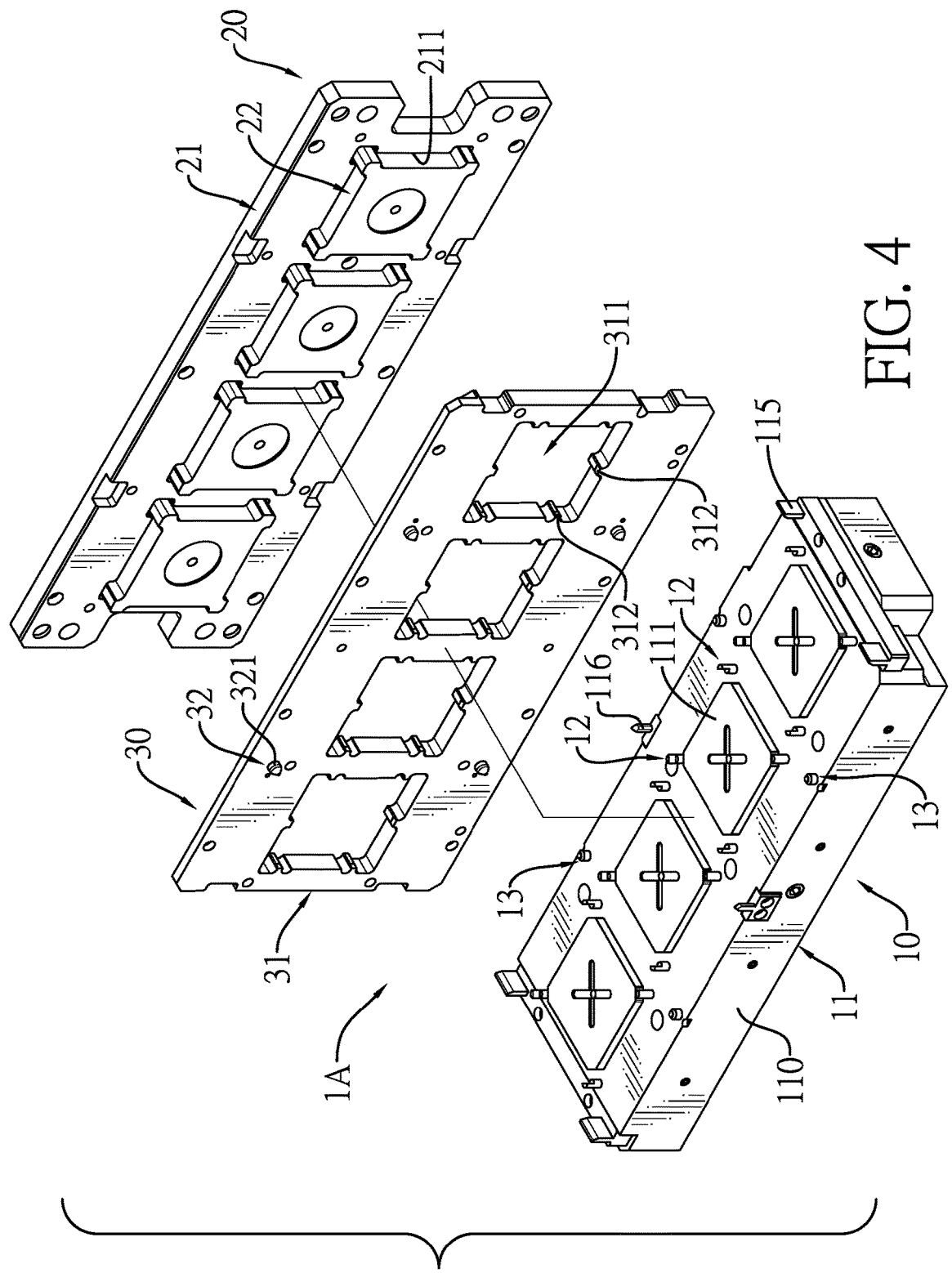
FIG. 4 is an exploded perspective view of a second embodiment of a compressing jig in accordance with the present invention.
Figure 5:
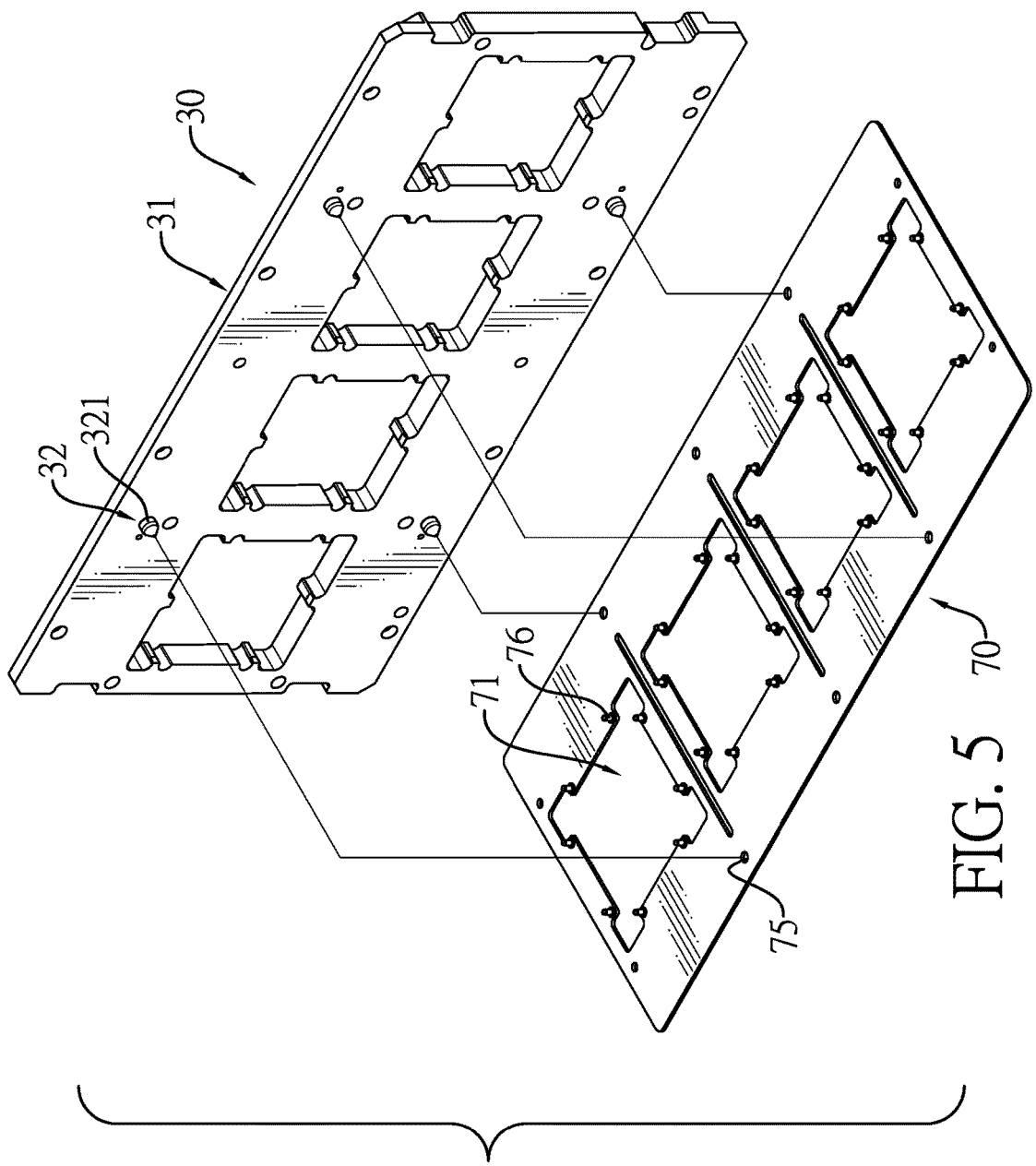
FIG. 5 is a partial exploded perspective view of the compressing jig in FIG. 4, shown with a carrier.
Figure 6:
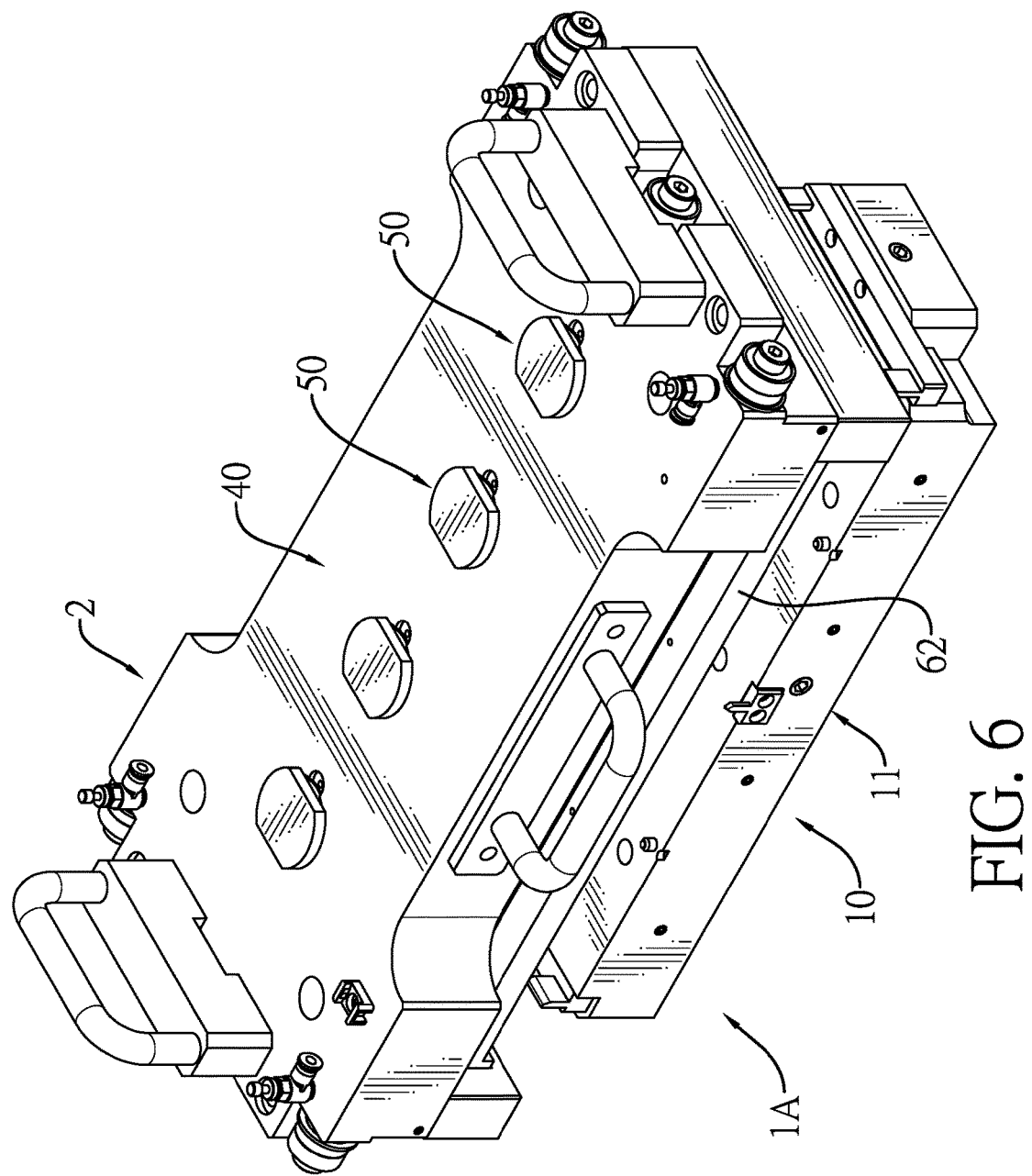
FIG. 6 is a perspective view of the compressing jig in FIG. 4, shown with a pressing device to form a compressing apparatus.
Figure 7:
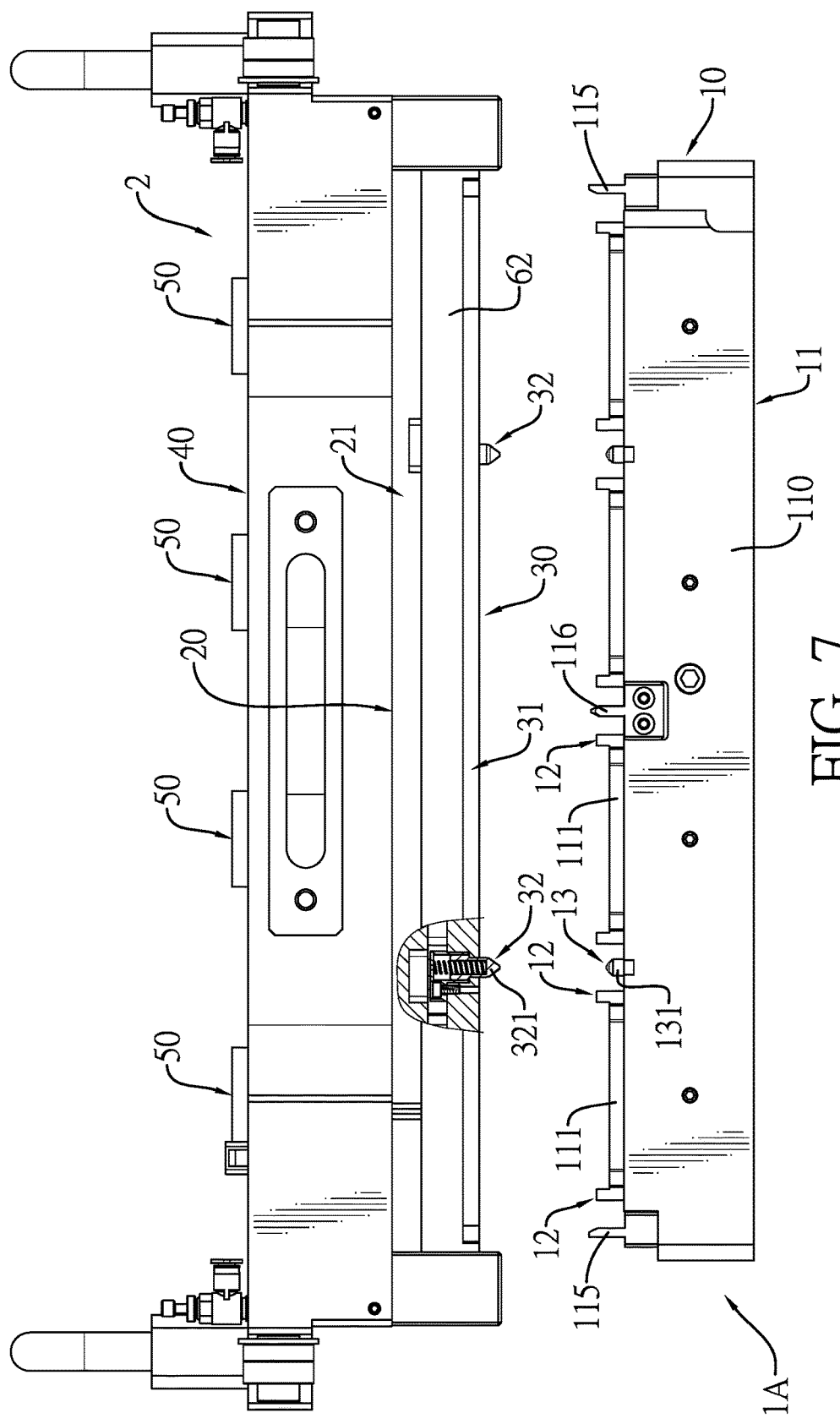
FIG. 7 is a partially sectional side view of the compressing apparatus in FIG. 6.
Figure 8:
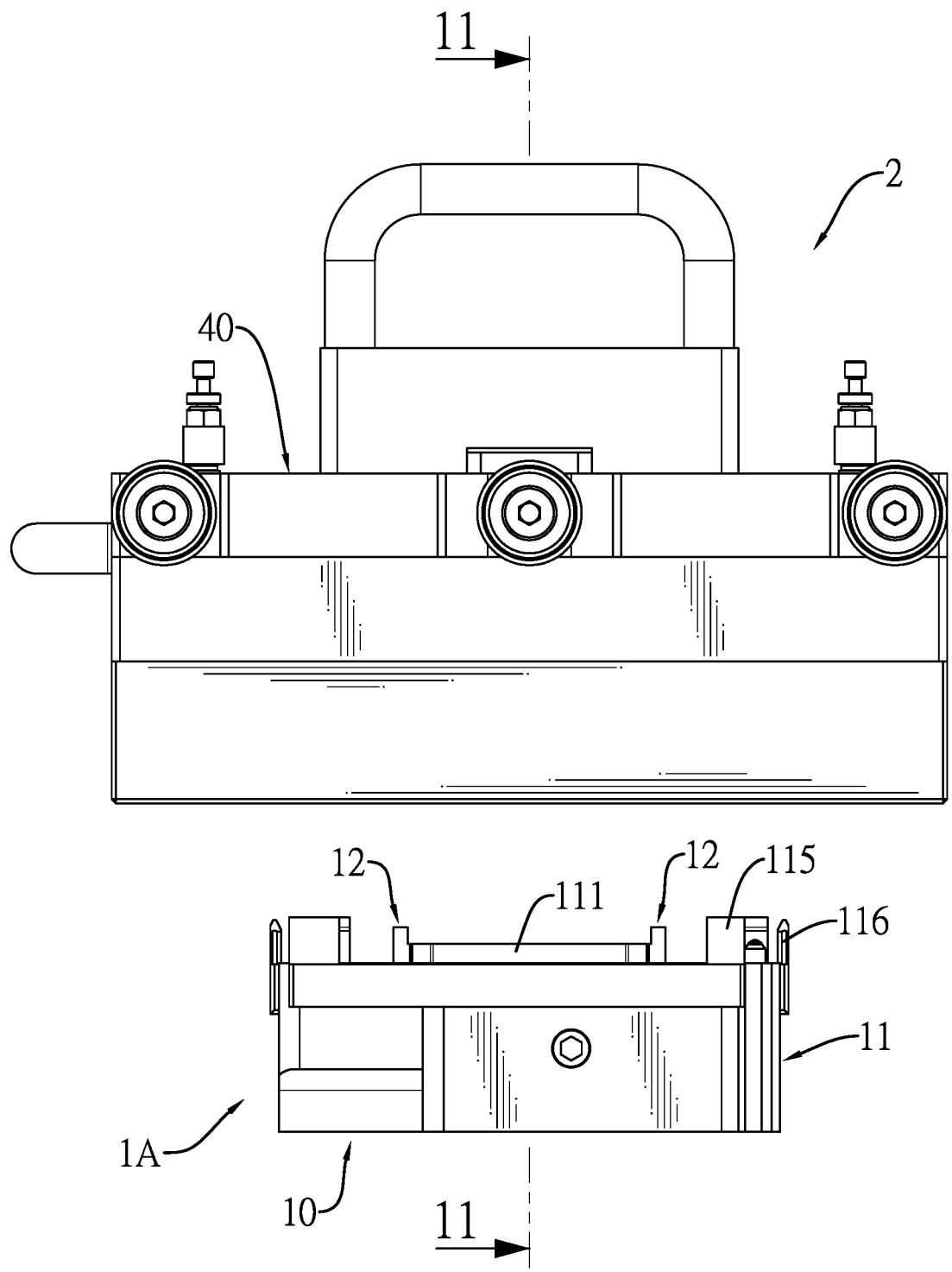
FIG. 8 is another side view of the compressing apparatus in FIG. 6.
Figure 9:
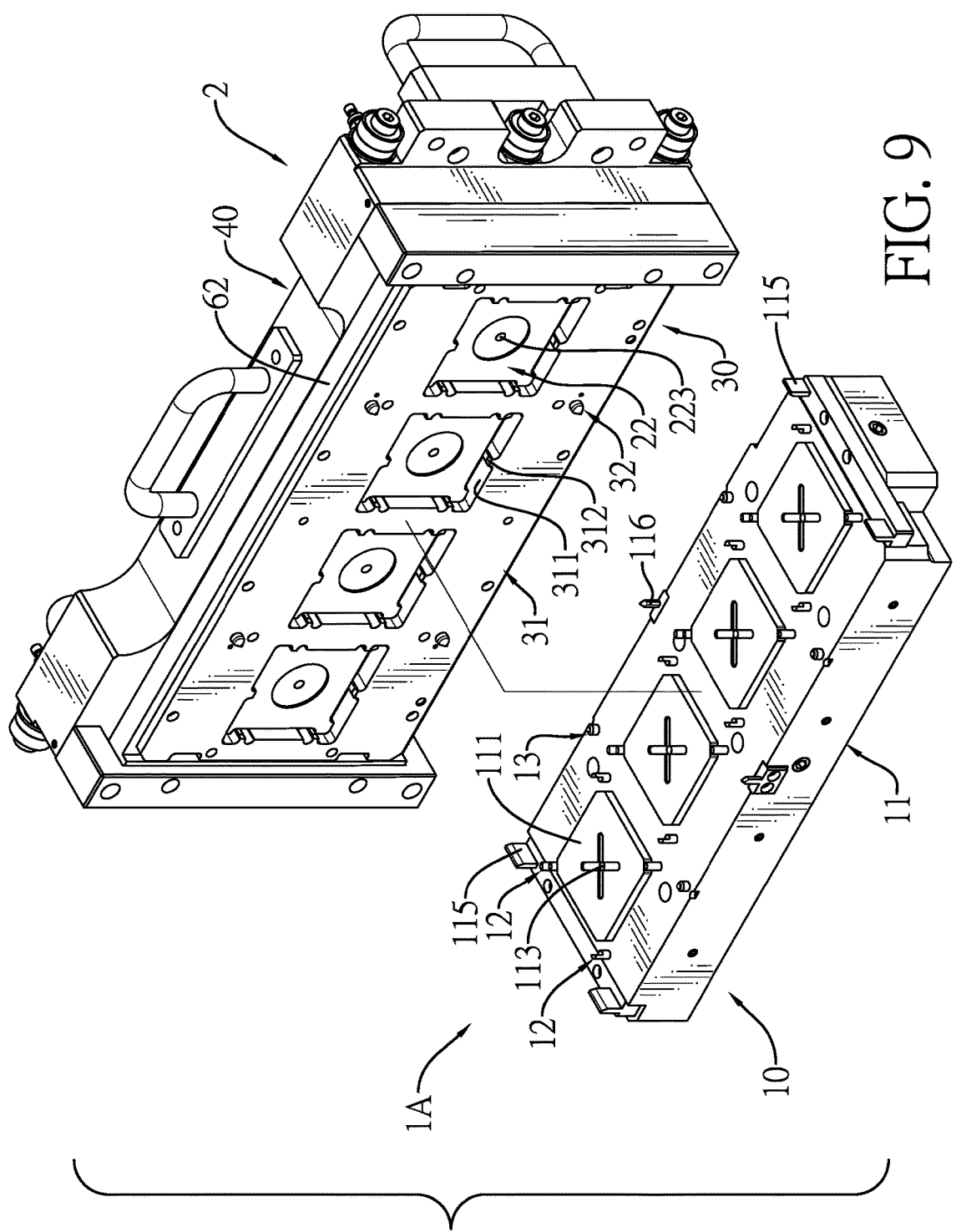
FIG. 9 is a partially exploded perspective view of the compressing apparatus in FIG. 6.

With reference to FIGS. 4 and 5, the second embodiment of the compressing jig 1A in accordance with the present invention has a lower compressing assembly 10 and an upper compressing assembly 20 as shown in FIGS. 1 to 3. In the second embodiment of the present invention, the compressing jig 1A has a middle compressing assembly 30. The middle compressing assembly 30 is disposed between the lower compressing assembly 10 and the upper compressing assembly 20, and is movable up and down. The middle compressing assembly 30 has a middle mount 31 and multiple abutting plungers 32. The middle mount 31 has at least one locating hole 311 respectively disposed around the at least one clamping plate 22. Each one of the at least one locating hole 311 has an edge and multiple guiding faces 312. The multiple guiding faces 312 are disposed along the edge of the locating hole 311 and incline toward the center of the locating hole 311. Each one of the at least one locating hole 311 is utilized for a work piece disposed on the carrier 70 to mount in the locating hole 311 from bottom to top. The multiple guiding faces 312 of each locating hole 311 guide an upper part and a lower part of the work piece to align with each other.

With reference to FIGS. 4 and 5, the multiple abutting plungers 32 are mounted to the middle mount 31. Each one of the abutting plungers 32 has an abutting pole 321 and a spring disposed between the abutting pole 321 and the middle mount 31. The spring of each one of the abutting plunger 32 abuts against the abutting pole 321 of the abutting plunger 32 to make the abutting pole 321 reach out from the middle mount 31. The multiple abutting plungers 32 and the multiple supporting plungers 13 are staggered in position. When the compressing jig 1A compresses the work pieces disposed on the carrier 70, the multiple abutting plungers 32 press the carrier 70 to make the carrier 70 abut against the top face of the lower mount 11 of the lower compressing assembly 10. Then, the work pieces abutted by the at least one pitching plate 111 are detached from the carrier 70.

The above-mentioned compressing jigs 1, 1A may be accompanied with various kinds of pressing devices to form a compressing apparatus. With reference to FIGS. 6 to 11, a compressing apparatus in accordance with the present invention has the compressing jig 1A and a pressing device 2. The compressing jig 1A has the lower compressing assembly 10, the upper compressing assembly 20, and the middle compressing assembly 30. The lower compressing assembly 10, the upper compressing assembly 20, and the middle compressing assembly 30 are same as that shown in FIGS. 1 to 5.

With reference to FIGS. 6 to 11, the pressing device 2 has a base 40, at least one pushing assembly 50, and a driving assembly 60. The base 40 has two opposite ends, a receiving space, two piston chambers 42, and a linking channel. The receiving space is disposed at a bottom of the base 40. The two piston chambers 42 are respectively disposed adjacent to the two opposite ends of the base 40. The two piston chambers 42 extend toward the lower compressing assembly 10 and to the receiving space of the base 40. The linking channel communicates with the two piston chambers 42 and is connected to a compressed air supplier.

Figure 10:
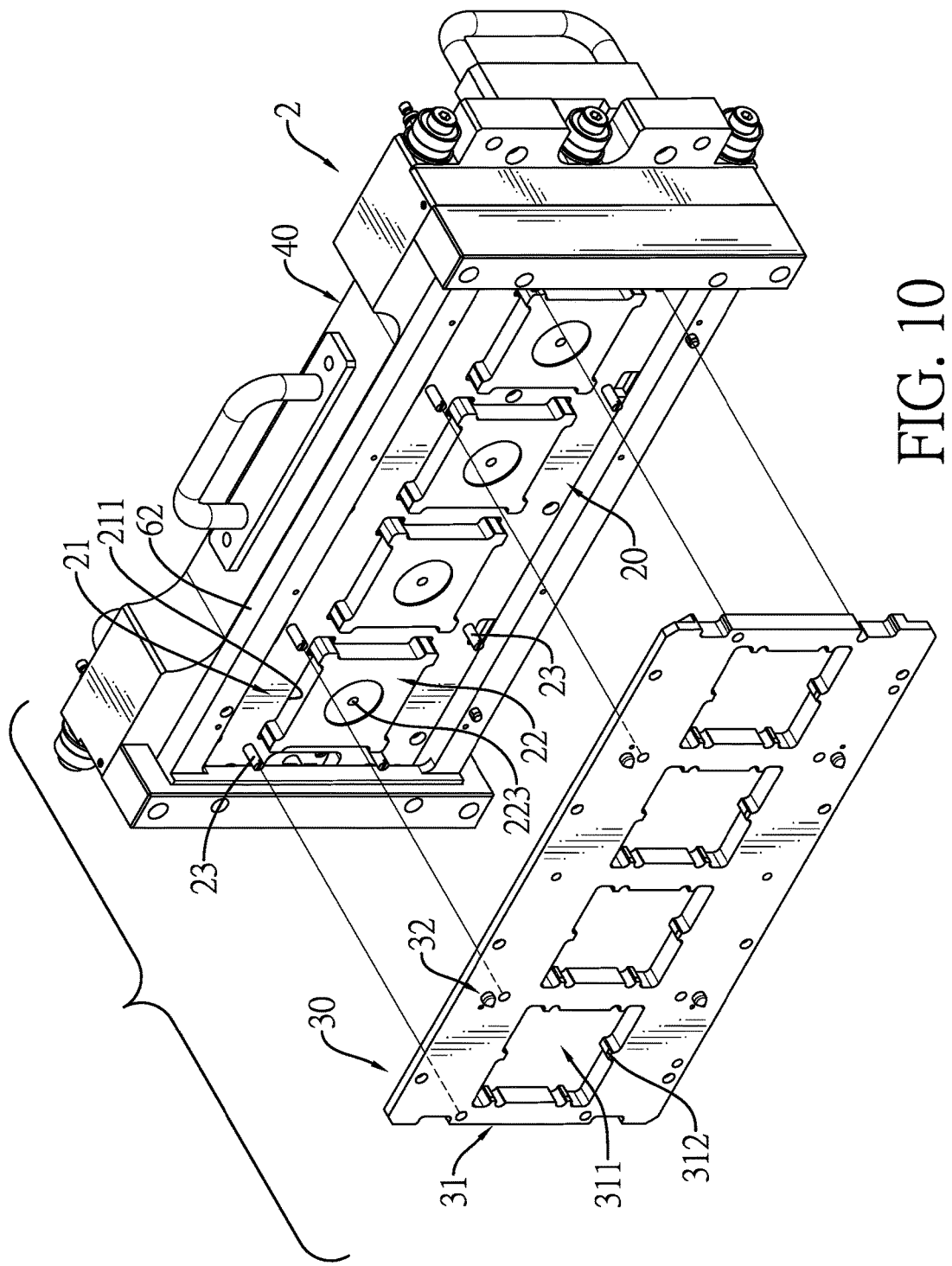
FIG. 10 is another partially exploded perspective view of the compressing apparatus in FIG. 6.
Figure 11:
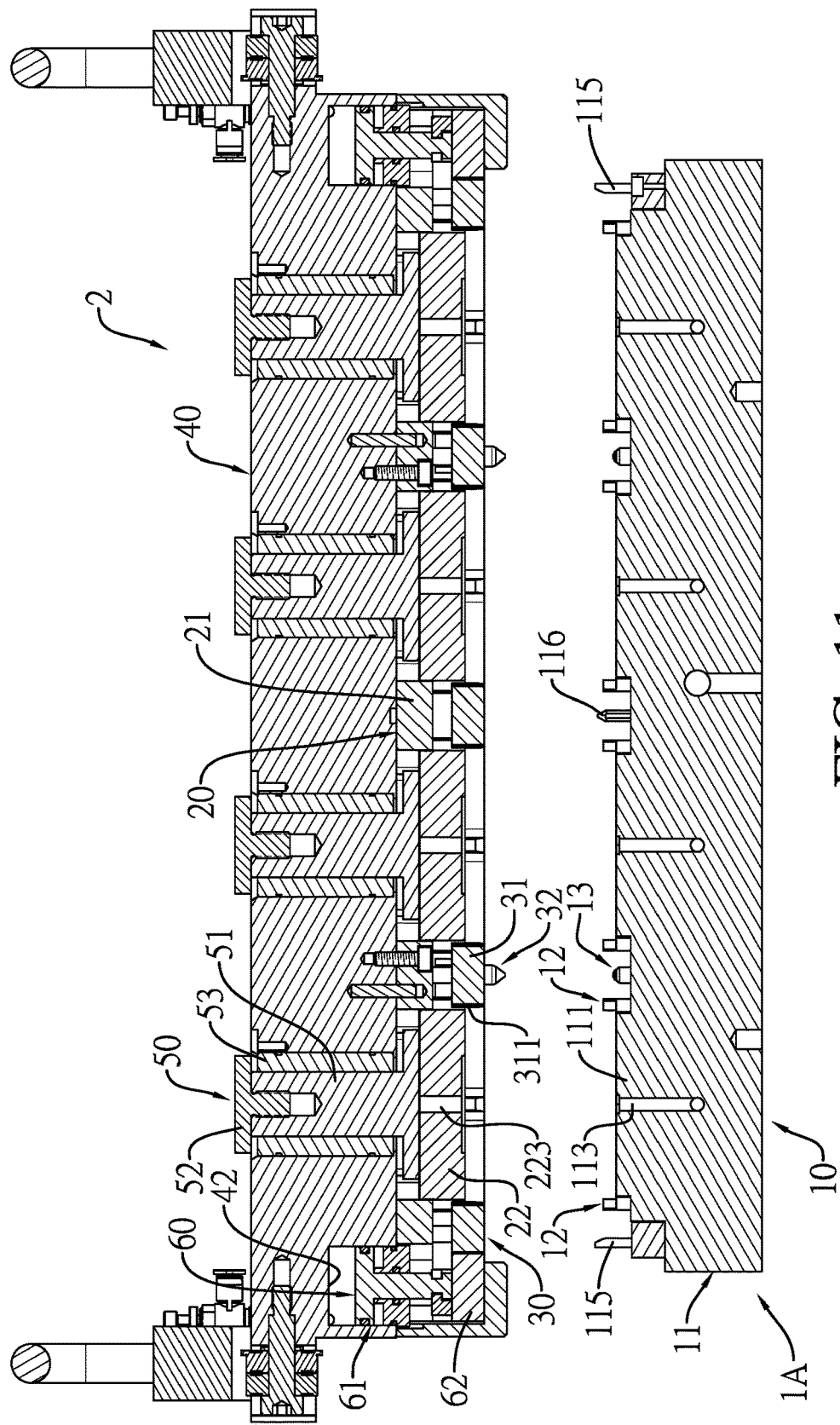
FIG. 11 is a side view in partial section of the compressing apparatus along line 11-11 in FIG. 8.

The upper compressing assembly 20 and the middle compressing assembly 30 of the compressing jig 1A are received in the receiving space of the base 40, and are movable up and down. With reference to FIG. 10, the upper mount 21 of the upper compressing assembly 20 has multiple guiding poles 23. The middle compressing assembly 30 moving up and down relative to the upper mount 21 is guided by the multiple guiding poles 23.

The at least one pushing assembly 50 is mounted through the base 40 corresponding to the at least one clamping plate 22 in position. Each one of the at least one pushing assembly 50 is utilized for providing a corresponding clamping plate 22 with a predetermined force. Each one of the at least one pushing assembly 50 has a pushing bar 51, a weighting block 52, and a linear bushing 53. The pushing bar 51 of each one of the at least one pushing assembly 50 is mounted through the base 40, is movable up and down, and has an upper end and a lower end opposite each other. The lower end of the pushing bar 51 of each one of the at least one pushing assembly 50 is connected to the corresponding clamping plate 22. The weighting block 52 is disposed at a top portion of the base 40 and connected to the upper end of the pushing bar 51 of the pushing assembly 50. The linear bushing 53 of each one of the at least one pushing assembly 50 is mounted around the pushing bar 51. The weight of the weighting block 52 is determined according to a required pressure of each one of the working pieces.

The driving assembly 60 is mounted inside the base 40, is connected to the middle compressing assembly 30, and drives the middle compressing assembly 30 to move up and down. The driving assembly 60 may be a pneumatic cylinder, an electric cylinder, and so on. In the pressing device 2 in accordance with the present invention, the driving assembly 60 has two piston rods 61 and a movable frame 62. The two piston rods 61 are respectively received in the two piston chambers 42 of the base 40. The movable frame 62 is connected to the middle compressing assembly 30. The upper compressing assembly 20 is movable up and down relative to the movable frame 62. The movable frame 62 has two opposite ends. The two opposite ends of the movable frame 62 respectively extend in the two piston chambers 42 from the receiving space of the base 40, and are respectively connected to the two piston rods 61. The driving assembly 60 drives the middle compressing assembly 30 that is connected to the movable frame 62 up and down by a pneumatic means.

The compressing apparatus in accordance with the present invention may be applied for semiconductor device packaging processes. With reference to FIGS. 3 and 5, the carrier 70 has a lengthwise direction and at least one disposing section, at least one disposing opening, multiple positioning holes 74, multiple aligning holes 75, and multiple locating sets. The at least one disposing section of the carrier 70 is disposed along the lengthwise direction of the carrier 70 and respectively disposed corresponding to the at least one pitching plate 111 in position. The at least one disposing opening is respectively disposed within the at least one disposing section. Each one of the at least one disposing opening has a disposing hole 71 and four through holes 73. The disposing hole 71 of each disposing opening has an edge 72 and four corners.

The four through holes 73 are respectively disposed at the four corners of the disposing hole 71 and communicate with the disposing hole 71. The multiple positioning holes 74 are disposed corresponding to the multiple positioning poles 116 in position. The multiple positioning holes 74 are respectively disposed around the multiple positioning poles 116 of the lower compressing assembly 10 for accurately disposing the carrier 70 on the lower compressing assembly 10. The multiple aligning holes 75 are disposed corresponding to the multiple abutting plungers 32 in position. The multiple aligning holes 75 are designed for the multiple abutting plungers 32 to pass through. The at least one locating set is respectively disposed within the at least one disposing section. Each one of the at least one locating set has multiple locating poles 76 disposed around a corresponding disposing opening.

At least one semiconductor device 80 is respectively disposed on the at least one disposing section of the carrier 70. Each one of the at least one semiconductor device 80 has a heat spreader 82 and a substrate 81 with a die. Conductive adhesive is coated on the substrate 81 for combining the substrate 81 and the heat spreader 82.

Figure 12:
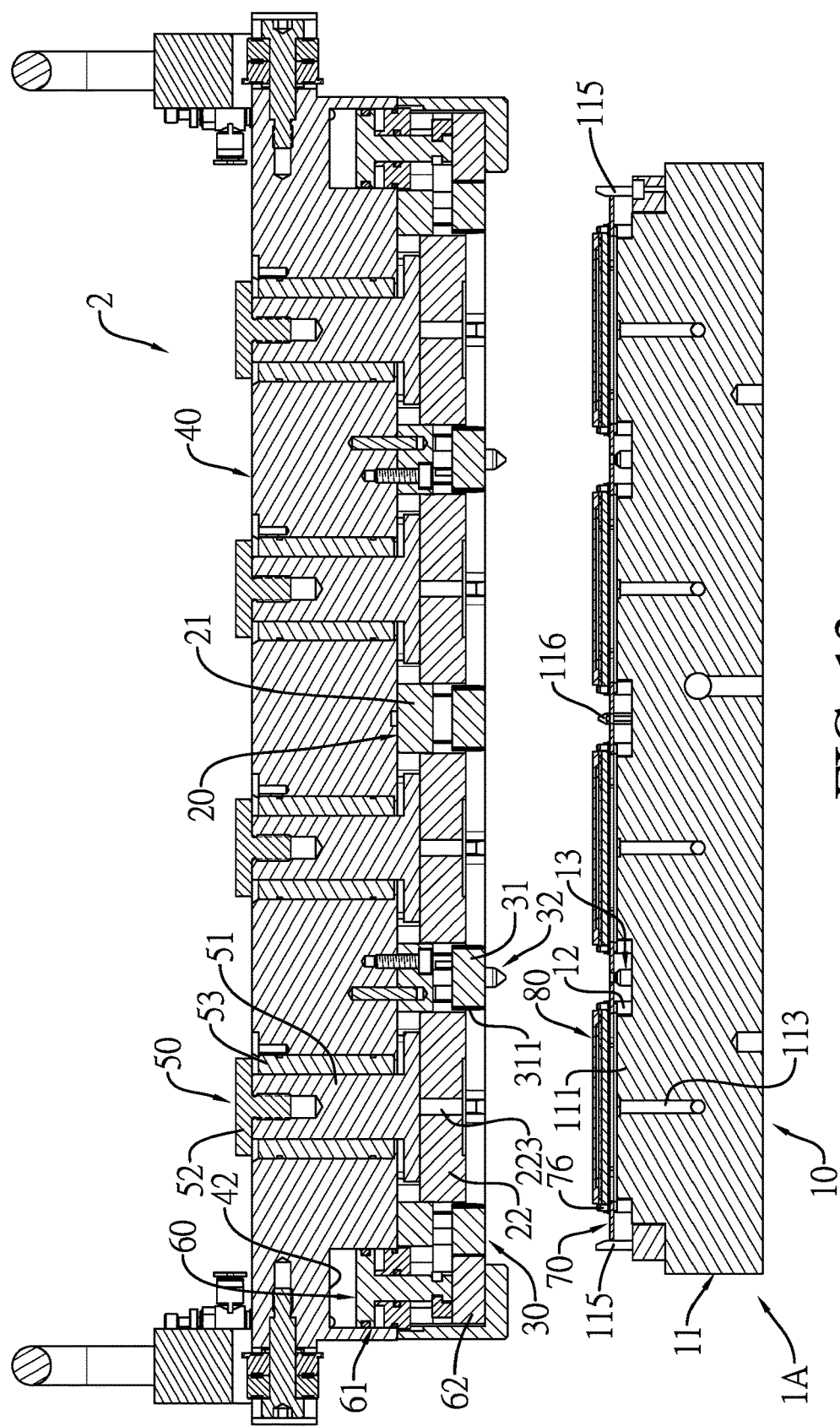
FIGS. 12 to 18 are operational side views in partial section of the compressing apparatus along line 11-11 in FIG. 8.
Figure 13:
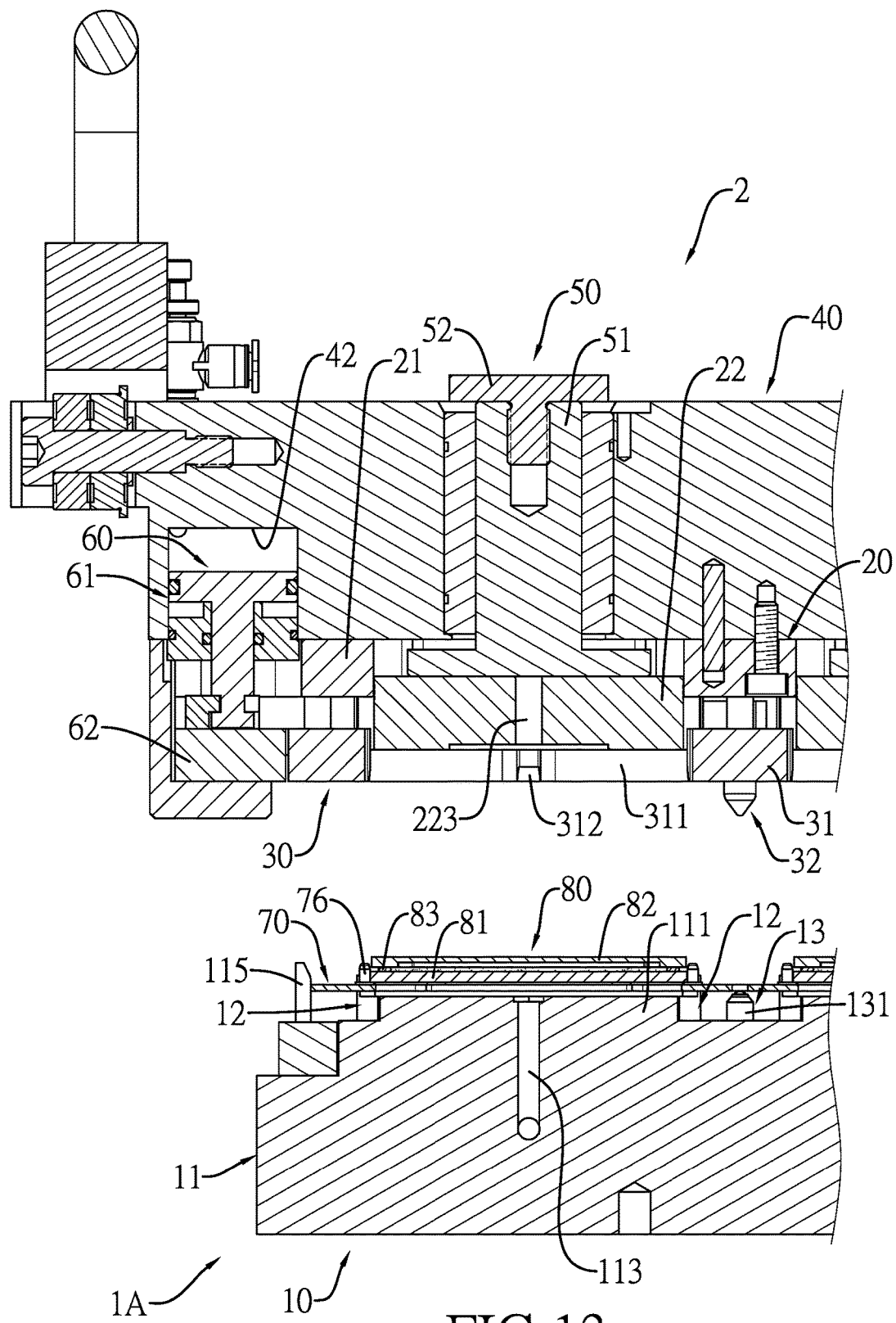

With reference to FIGS. 12 and 13, the carrier 70 with the at least one semiconductor device 80 is disposed between the lower compressing assembly 10 and the middle compressing assembly 30 and on the upper portion of the lower compressing assembly 10. The at least one semiconductor device 80 is disposed corresponding to the at least one pitching plate 111, the at least one limiting set, the at least one clamping plate 22, and the at least one locating hole 311 in position.

For concise descriptions, one of the at least one semiconductor device 80 is referred to hereafter. The carrier 70 is limited by the two blocking protrusions 115 of the lower compressing assembly 10. The two positioning holes 74 of the carrier 70 are respectively disposed around the two positioning poles 116 of the lower compressing assembly 10 to make the carrier 70 accurately disposed on the lower compressing assembly 10. The multiple supporting plungers 13 abut against the carrier 70 to make the carrier 70 disposed above the top face of the main body 110 of the lower mount 11. The carrier 70 and the top face of the main body 110 are separated by a gap and do not contact each other. The at least one disposing hole 71 is respectively disposed corresponding to the at least one pitching plate 111 of the lower mount 11 in position. The four corners of the semiconductor device 80 are respectively disposed corresponding to the four limiting indentions 121 of the four poles 12 of a corresponding limiting set.

With reference to FIGS. 12 and 13, the elevating mechanism connected to the lower compressing assembly 10 pushes up the carrier 70 and the semiconductor devices 80. The abutting poles 321 of each one of the multiple abutting plungers 32 pass through a corresponding aligning hole 75 to align the carrier 70 again. The lower compressing assembly 10 and the carrier 70 with the semiconductor device 80 are moved toward the middle compressing assembly 30 continuously. The semiconductor device 80 is mounted in a corresponding locating hole 311 of the middle mount 31 of the middle compressing assembly 30. The lower compressing assembly 10 is pushed up continuously. The carrier 70 is abutted by the multiple abutting poles 321 of the multiple abutting plungers 32. Then, the carrier 70 presses the multiple supporting poles 131 of the multiple supporting plungers 13 and forces the multiple supporting poles 131 to retract into the main body 110 of the lower mount 11, and the carrier 70 abuts against the top face of the main body 110.

The at least one pitching plate 111 of the lower mount 11 respectively passes through the at least one disposing hole 71 of the carrier 70. The semiconductor device 80 is pushed by a corresponding pitching plate 111, and enters the corresponding locating hole 311 of the middle mount 31. The guiding face 312 of each one of the at least one locating hole 311 of the middle mount 31 guides the heat spreader 82 and the substrate 81 of the semiconductor device 80 in sequence. Therefore, the upper heat spreader 82 and the lower substrate 81 of the semiconductor device 80 are able to be aligned with each other.

Figure 14:
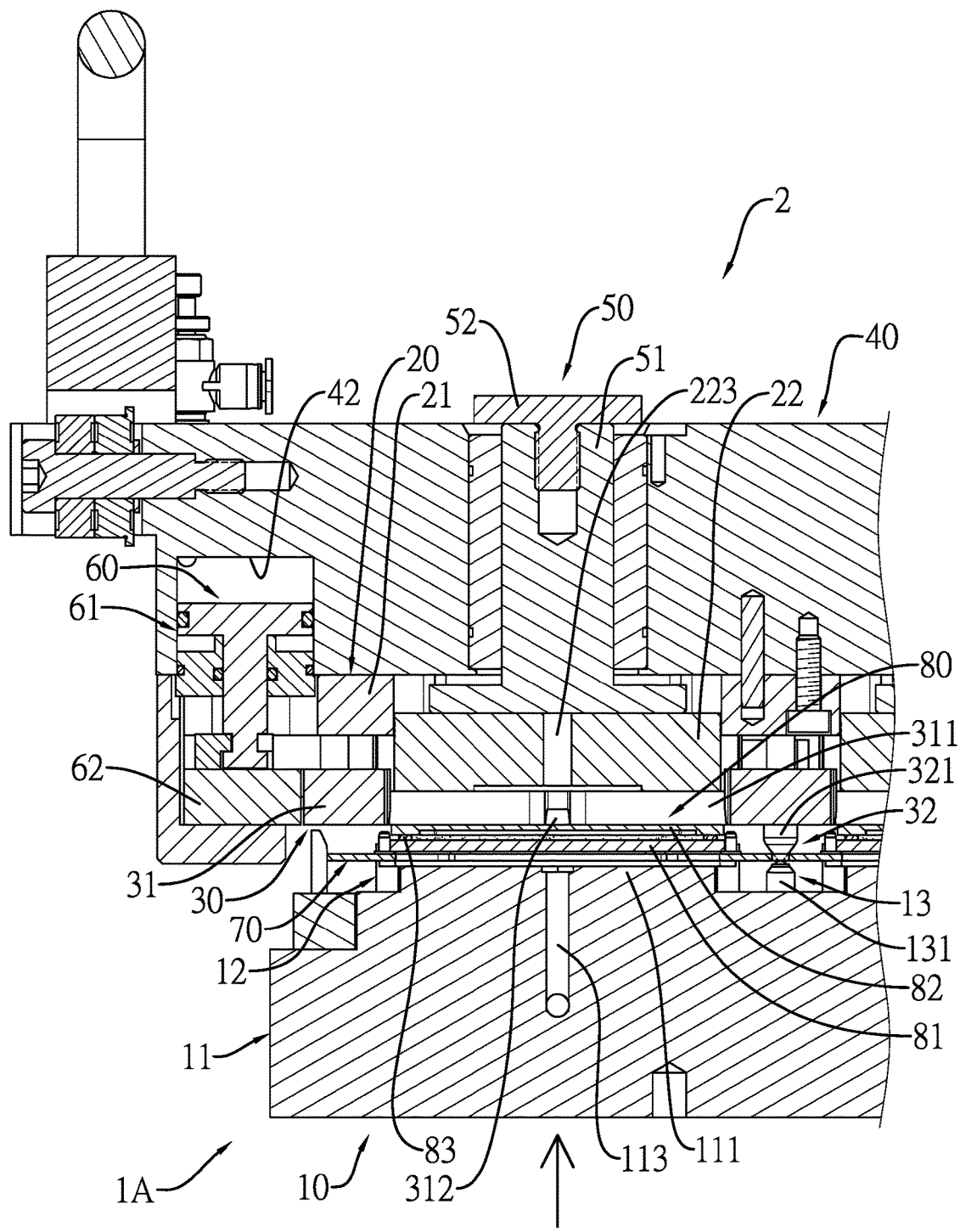
Figure 15:
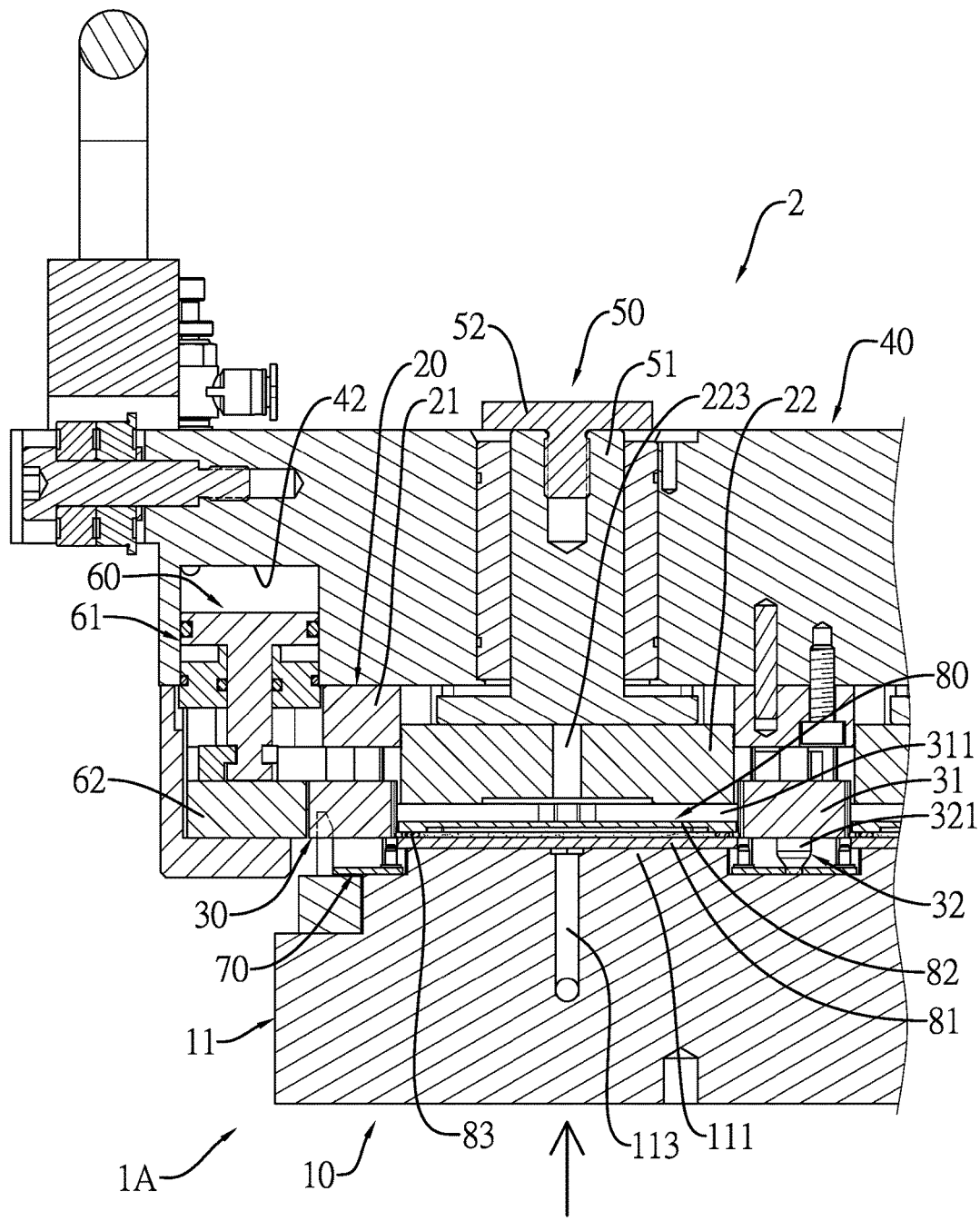
Figure 16:
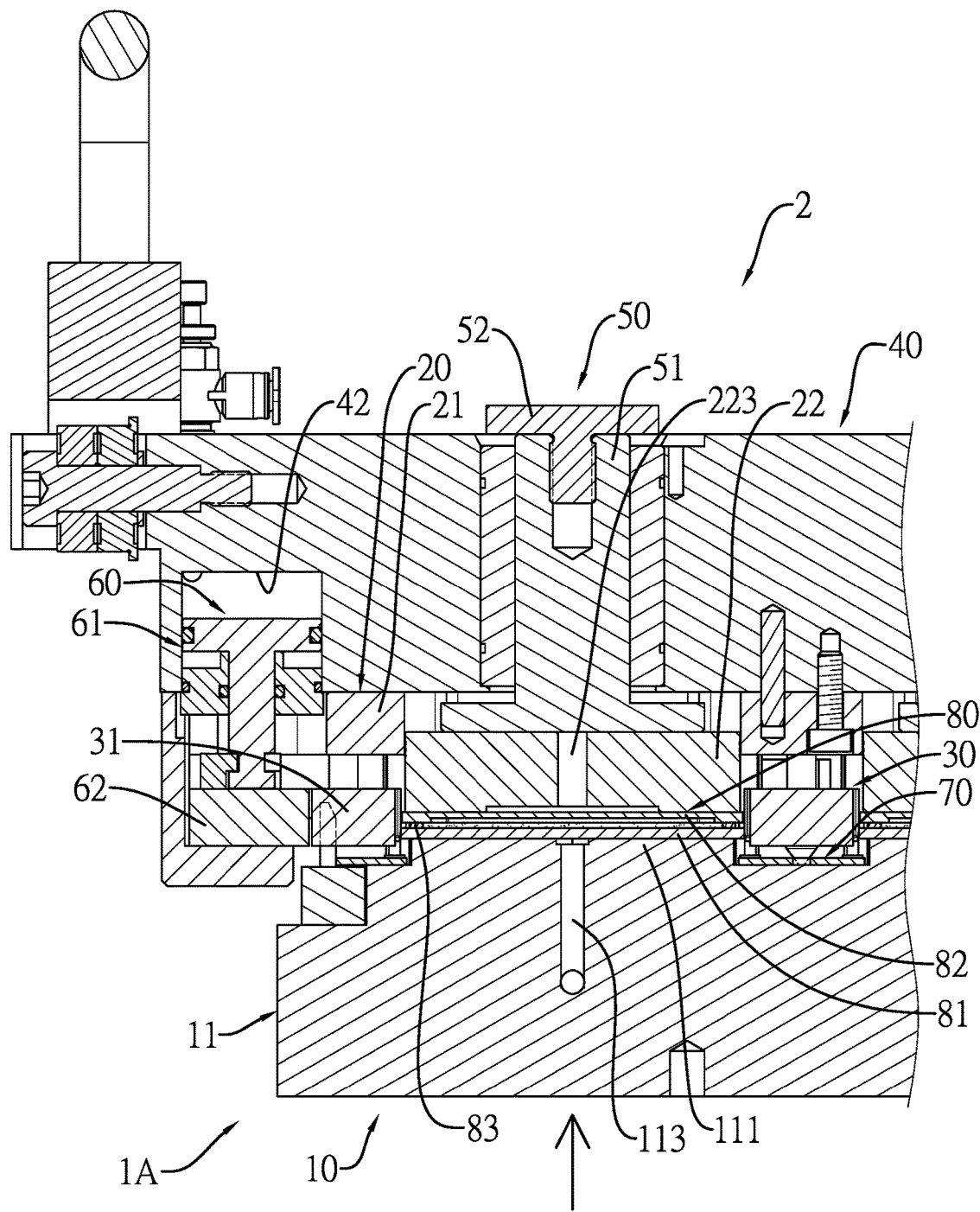

With reference to FIGS. 14, 15, and 16, the lower compressing assembly 10, the carrier 70, and the semiconductor device 80 are moved up continuously to make the semiconductor device 80 enter a corresponding locating hole 311 of the middle mount 31 completely. The carrier 70 is clamped between the middle mount 31 of the middle compressing assembly 30 and the main body 110 of the lower mount 11 of the lower compressing assembly 10. The multiple poles 12 of a corresponding limiting set reach into the corresponding locating hole 311 of the middle mount 31 of the middle compressing assembly 30. The vacuum pump sucks the substrate 81 of the semiconductor device 80 through a corresponding exhausting hole 113 to make the substrate 81 disposed on the pitching face of a corresponding pitching plate 111.

The four corners of the semiconductor device 80 respectively abut against the four limiting indentions 121 of the four poles 12 of the corresponding limiting set. When the heat spreader 82 of the semiconductor device 80 contacts the clamping face of a corresponding clamping plate 22, the vacuum pump sucks the heat spreader 82 of the semiconductor device 80 through a corresponding venting hole 223 to make the heat spreader 82 disposed on the clamping face of the corresponding clamping plate 22. Therefore, the substrate 81 and the heat spreader 82 of the semiconductor device 80 are parallel to each other.

Figure 17:
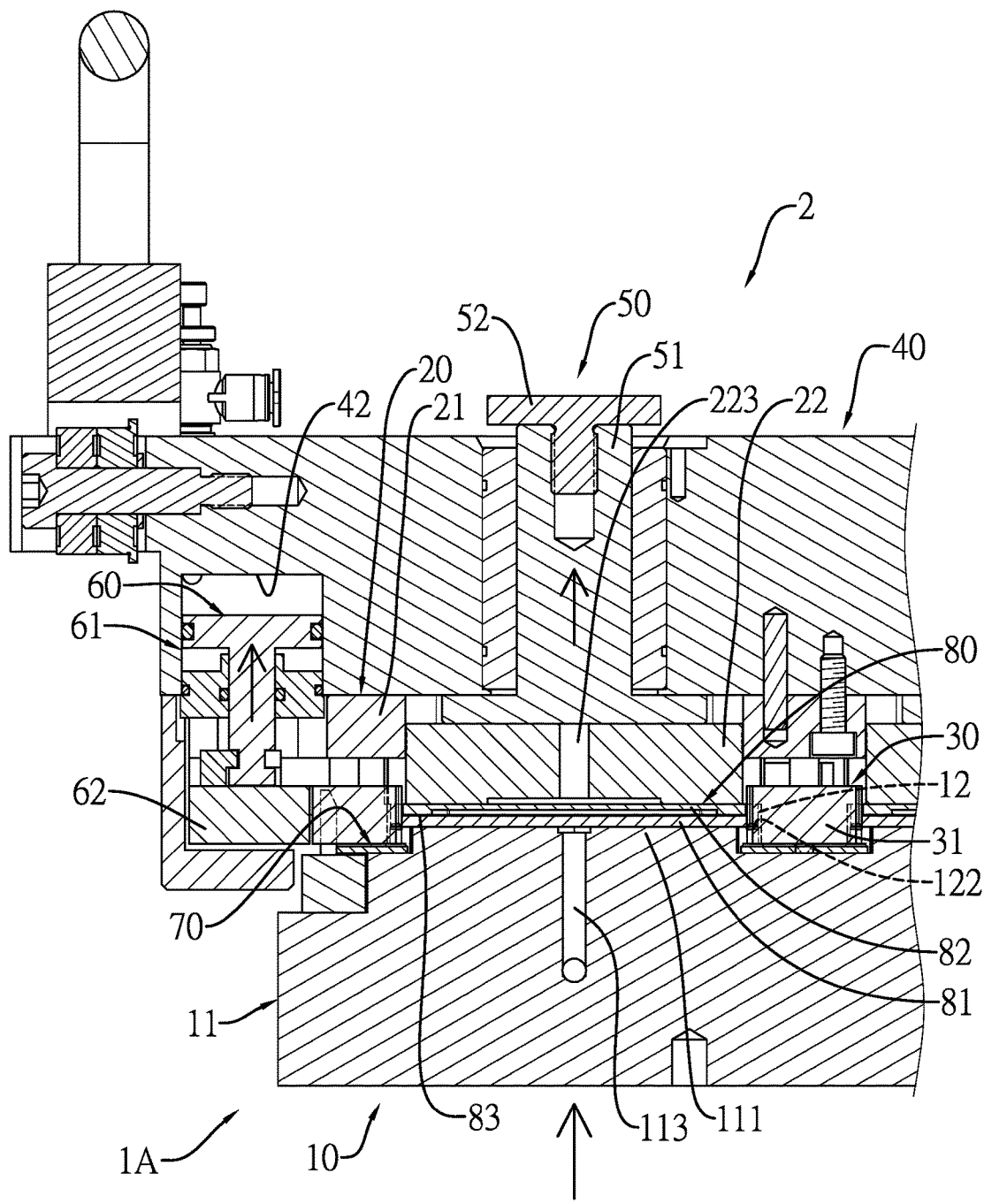

With reference to FIGS. 16 and 17, when the lower compressing assembly 10, the carrier 70, and the semiconductor device 80 are moved up to a pre-determined height, the two piston rods 61 of the driving assembly 60 drive the middle compressing assembly 30 connected to the movable frame 62 to move upwardly with the lower compressing assembly 10.

The corresponding pitching plate 111 pushes the semiconductor device 80. The at least one pushing assembly 50 is respectively abutted by the at least one semiconductor device 80. The weighting block 52 of a corresponding pushing assembly 50 of the semiconductor device 80 is abutted by the pushing bar 51 of the corresponding pushing assembly 50, and detaches from the base 40. The semiconductor device 80 is subjected to a downward force provided by the weighting block 52 of the corresponding pushing assembly 50 that detaches from the base 40 and an upward force provided by the lower compressing assembly 10. When the top end of each one of the multiple poles 12 of the corresponding limiting set abuts against the upper mount 21, the semiconductor device 80 is disposed at a pre-determined height, and can be processed by even compression because a height of each one of the limiting indentions 121 is limited in a pre-determined value. The thermal conductive adhesive 83 is solidified during the compressing process and combines the substrate 81 and the heat spreader 82 of the semiconductor device 80.

Figure 18:
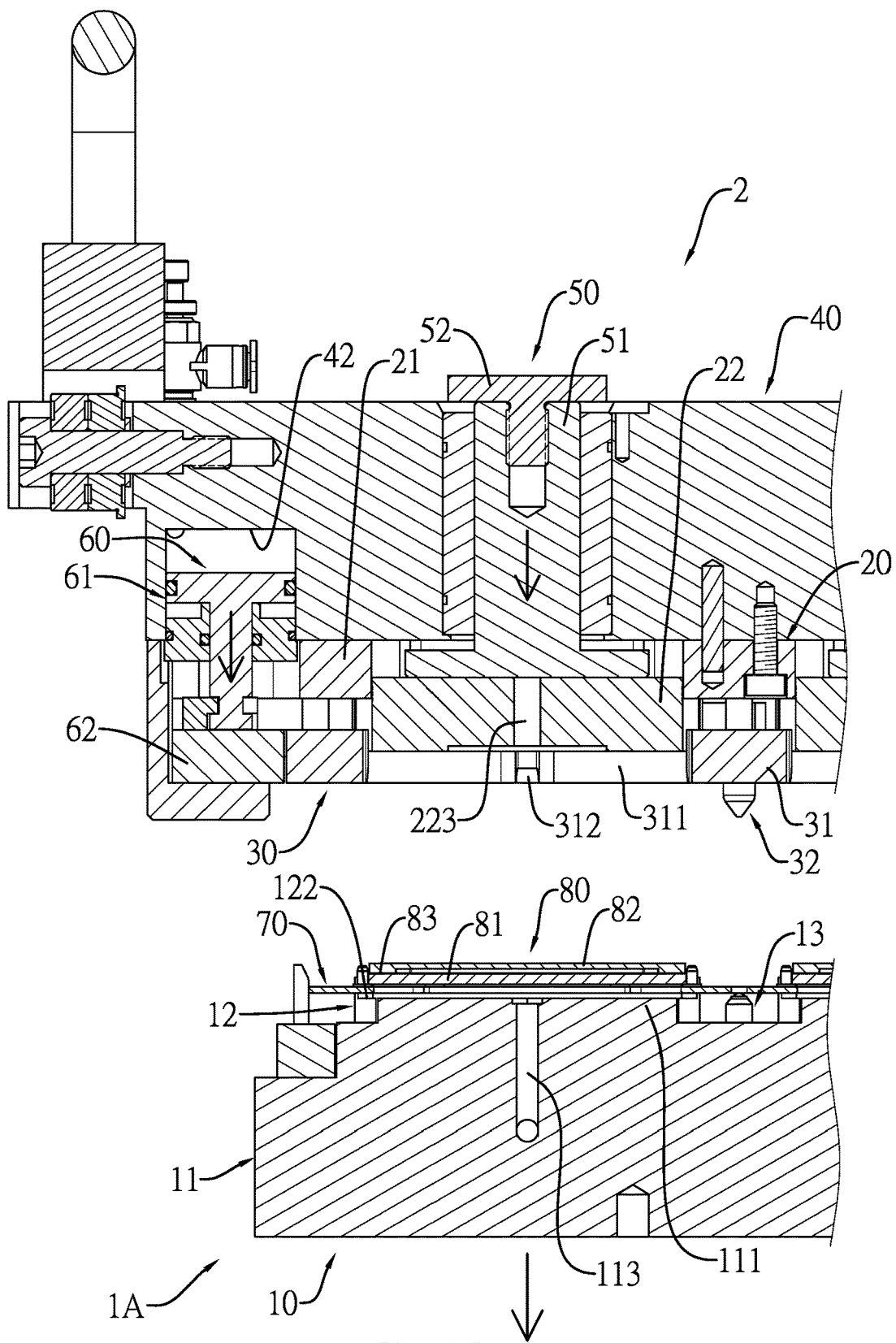

With reference to FIGS. 17 and 18, after the compressing process, the vacuum pump stops sucking the heat spreader 82 of the semiconductor 80 through a corresponding clamping plate 22. The elevating mechanism drives the lower compressing assembly 10 to move down. The driving assembly 60 mounted inside the base 40 drives the movable frame 62 and the middle compressing assembly 30 to move down with the lower compressing assembly 10. When the carrier 70 detaches from the multiple abutting poles 321 of the multiple abutting plungers 32, the multiple supporting plungers 13 of the lower compressing assembly 10 push the carrier 70 to detach from the lower compressing assembly 10. Then, the carrier 70 supports the semiconductor device 80 again. The vacuum pump stops sucking the substrate 81 of the semiconductor device 80. The semiconductor device 80 is fully sustained by the carrier 70 and detaches from four supporting portions 122 of four limiting indentions 121 of the corresponding limiting set. Finally, remove the carrier 70 with the semiconductor device 80 to accomplish a compressing process of semiconductor devices.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A compressing jig comprising:
    a lower compressing assembly having
        a lower mount having
            a main body having a top portion and a top face disposed at the top portion of the main body;
            a positioning area disposed at the top portion of the main body;
            at least one locating section disposed within the positioning area;
            at least one pitching plate disposed on the top face of the main body, respectively within the at least one locating section, and protruding upward;
            each one of the at least one pitching plate having a pitching face with a middle portion; and
            at least one exhausting channel formed inside the main body, respectively extending through at least one middle portion of at least one pitching face of the at least one pitching plate;
            each one of the at least one exhausting channel having an exhausting hole;
            at least one exhausting hole respectively disposed at the at least one middle portion of the at least one pitching face of the at least one pitching plate; and
        at least one limiting set respectively disposed within the at least one locating section and each one of the at least one limiting set having
            multiple poles disposed on the top face of the main body and around a corresponding pitching plate;
            each one of the multiple poles having
                a top end higher than the at least one pitching face;
                a limiting indention disposed at the top end and having a supporting portion disposed at a same height with the at least one pitching face; and
    an upper compressing assembly disposed above the lower compressing assembly and having
        an upper mount having at least one receiving hole; and
        at least one clamping plate respectively aligned with the at least one pitching plate, respectively aligned with the at least one limiting set, and respectively disposed in the at least one receiving hole;
        each one of the at least one clamping plate being movable up and down in a corresponding one of the at least one receiving hole and having
            a clamping face parallel to the pitching face of one of the at least one corresponding pitching plate; and
            a venting channel extending through a middle portion of the clamping face, and having a venting hole disposed at the middle portion of the clamping face.

2. The compressing jig as claimed in claim 1, wherein the lower compressing assembly has
    at least two blocking portions protruding upward, disposed adjacent to an edge of the positioning area, and separated by the positioning area;
    multiple positioning poles disposed within the positioning area and divided into multiple pairs;
    the two positioning poles of each pair separated by the at least one locating section; and
    multiple supporting plungers disposed within the positioning area.

3. The compressing jig as claimed in claim 2, wherein each one of the at least one receiving hole has
    a main area with four corners; and
    four minor areas respectively disposed at the four corners of the main area;
    each one of the at least one clamping plate has
        a main portion with four corners received in the main area of a corresponding one of the at least one receiving hole and disposed above a corresponding one of the at least one pitching plate; and
        four minor portions respectively disposed at the four corners of the main portion and respectively received in the four minor areas of the corresponding receiving hole; and
    the four minor portions disposed above the multiple supporting portions of the multiple limiting indentions of the multiple poles.

4. The compressing jig as claimed in claim 3, wherein each one of the at least one pitching plate has a cross grove with a middle portion;
    the at least one exhausting hole of the at least one exhausting channel is respectively disposed at the middle portion of the cross groove of the at least one pitching plate and respectively communicates with the at least one exhausting channel and the at least one cross groove;
    each one of the at least one clamping plate has a round recess with a middle portion;
    the at least one venting hole of the at least one venting channel is respectively disposed at the middle portion of the round recess of the at least one clamping plate and respectively communicates with the at least one venting channel and the at least one round recess.

5. The compressing jig as claimed in claim 1, wherein the compressing jig has
    a middle compressing assembly disposed between the lower compressing assembly and the upper compressing assembly, mounted to a bottom of the upper compressing assembly, being movable up and down, and having
        a middle mount having
            at least one locating hole respectively disposed around the at least one clamping plate;
            each one of the at least one locating hole having
                an edge; and
                multiple guiding faces disposed along the edge of the locating hole and inclining toward the center of the locating hole.

6. The compressing jig as claimed in claim 4, wherein the compressing jig has
    a middle compressing assembly disposed between the lower compressing assembly and the upper compressing assembly, mounted to a bottom of the upper compressing assembly, being movable up and down, and having
a middle mount having
at least one locating hole respectively disposed around the at least one clamping plate;
each one of the at least one locating hole having an edge; and
multiple guiding faces disposed along the edge of the locating hole and inclining toward the center of the locating hole.

7. The compressing jig as claimed in claim 5, wherein the middle compressing assembly has multiple abutting plungers mounted to a surface of the middle mount.

8. The compressing jig as claimed in claim 6, wherein the middle compressing assembly has multiple abutting plungers mounted to a surface of the middle mount.

9. A compressing apparatus comprising:
the compressing jig as claimed in claim 5; and
a pressing device having
a base having a receiving space; wherein
the upper compressing assembly and the middle compressing assembly of the compressing jig are received in the receiving space; and
the lower compressing assembly is disposed below the base;
at least one pushing assembly mounted inside the base, being movable up and down inside the base, respectively connected to the at least one clamping plate of the upper compressing assembly, and respectively pushing the at least one clamping plate; and
a driving assembly mounted inside the base, connected to the middle compressing assembly, and driving the middle compressing assembly up and down.

10. A compressing apparatus comprising:
the compressing jig as claimed in claim 6; and
a pressing device having
a base having a receiving space; wherein
the upper compressing assembly and the middle compressing assembly of the compressing jig are received in the receiving space; and
the lower compressing assembly is disposed below the base;
at least one pushing assembly mounted inside the base, being movable up and down inside the base, respectively connected to the at least one clamping plate of the upper compressing assembly, and respectively pushing the at least one clamping plate; and
a driving assembly mounted inside the base, connected to the middle compressing assembly, and driving the middle compressing assembly up and down.

11. A compressing apparatus comprising:
the compressing jig as claimed in claim 7; and
a pressing device having
a base having a receiving space; wherein
the upper compressing assembly and the middle compressing assembly of the compressing jig are received in the receiving space; and
the lower compressing assembly is disposed below the base;
at least one pushing assembly mounted inside the base, being movable up and down inside the base, respectively connected to the at least one clamping plate of the upper compressing assembly, and respectively pushing the at least one clamping plate; and
a driving assembly mounted inside the base, connected to the middle compressing assembly, and driving the middle compressing assembly up and down.

12. A compressing apparatus comprising:
the compressing jig as claimed in claim 8; and
a pressing device having
a base having a receiving space; wherein
the upper compressing assembly and the middle compressing assembly of the compressing jig are received in the receiving space; and
the lower compressing assembly is disposed below the base;
at least one pushing assembly mounted inside the base, being movable up and down inside the base, respectively connected to the at least one clamping plate of the upper compressing assembly, and respectively pushing the at least one clamping plate; and
a driving assembly mounted inside the base, connected to the middle compressing assembly, and driving the middle compressing assembly up and down.

13. The compressing apparatus as claimed in claim 9, wherein
each one of the at least one pushing assembly has
a pushing bar mounted through the base, being movable up and down, and having
an upper end; and
a lower end opposite the upper end of the pushing bar and connected to a corresponding one of the at least one clamping plate;
a weighting block disposed at an upper portion of the base and connected to the upper end of the pushing bar.

14. The compressing apparatus as claimed in claim 12, wherein
each one of the at least one pushing assembly has
a pushing bar mounted through the base, being movable up and down, and having
an upper end; and
a lower end opposite the upper end of the pushing bar and connected to a corresponding one of the at least one clamping plate;
a weighting block disposed at an upper portion of the base and connected to the upper end of the pushing bar.

15. The compressing apparatus as claimed in claim 9, wherein
the base has two piston chambers extending toward the lower compressing assembly and to the receiving space of the base; and
a linking channel communicates with the two piston chambers;
the driving assembly is a pneumatic mechanism and has
two piston rods respectively received in the two piston chambers of the base; and
a movable frame connected to the middle compressing assembly and having two opposite ends respectively extending in the two piston chambers from the receiving space of the base and respectively connected to the two piston rods.

16. The compressing apparatus as claimed in claim 12, wherein
the base has two piston chambers extending toward the lower compressing assembly and to the receiving space of the base; and
a linking channel communicates with the two piston chambers;
the driving assembly is a pneumatic mechanism and has two piston rods respectively received in the two piston chambers of the base; and a movable frame connected to the middle compressing assembly and having two opposite ends respectively extending in the two piston chambers from the receiving space of the base and respectively connected to the two piston rods.

17. The compressing apparatus as claimed in claim 13, wherein the base has two piston chambers extending toward the lower compressing assembly and to the receiving space of the base; and a linking channel communicates with the two piston chambers;

the driving assembly is a pneumatic mechanism and has
two piston rods respectively received in the two piston chambers of the base; and a movable frame connected to the middle compressing assembly and having two opposite ends respectively extending in the two piston chambers from the receiving space of the base and respectively connected to the two piston rods.

18. The compressing apparatus as claimed in claim 14, wherein the base has two piston chambers extending toward the lower compressing assembly and to the receiving space of the base; and a linking channel communicates with the two piston chambers;

the driving assembly is a pneumatic mechanism and has
two piston rods respectively received in the two piston chambers of the base; and a movable frame connected to the middle compressing assembly and having two opposite ends respectively extending in the two piston chambers from the receiving space of the base and respectively connected to the two piston rods.

* * * * *